(12) United States Patent
Büttner et al.

(10) Patent No.: US 10,541,074 B2
(45) Date of Patent: Jan. 21, 2020

(54) METHODS AND APPARATUS FOR MAKING MAGNETIC SKYRMIONS

(71) Applicant: Massachusetts Institute of Technology, Cambridge, MA (US)

(72) Inventors: Felix Büttner, Goettingen (DE); Ivan Lemesh, Cambridge, MA (US); Geoffrey S. D. Beach, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/971,206

(22) Filed: May 4, 2018

(65) Prior Publication Data
US 2019/0131049 A1    May 2, 2019

Related U.S. Application Data

(60) Provisional application No. 62/501,218, filed on May 4, 2017.

(51) Int. Cl.
*G11C 11/16*    (2006.01)
*G11C 11/18*    (2006.01)
(Continued)

(52) U.S. Cl.
CPC ........ *H01F 10/3259* (2013.01); *G11C 11/161* (2013.01); *G11C 11/1675* (2013.01);
(Continued)

(58) Field of Classification Search
CPC . H01F 10/3259; H01F 10/329; G11C 11/161; G11C 11/1675; G11C 11/18; H01L 43/00; H01L 43/02; H01L 43/10
See application file for complete search history.

(56) References Cited

U.S. PATENT DOCUMENTS 9,748,000 B2 *   8/2017  Nagaosa ................. G11B 5/65
10,141,068 B2 *  11/2018  Nagaosa ............... H01L 27/105
(Continued)

OTHER PUBLICATIONS

Berger, Emission of spin waves by a magnetic multilayer traversed by a current. Physical Review B 54, 9353-9358 (1996).
(Continued)

*Primary Examiner* — Ly D Pham
(74) *Attorney, Agent, or Firm* — Smith Baluch LLP

(57) ABSTRACT

A system and a method for the deterministic generation of magnetic skyrmions includes a magnetic strip configured to store and transport skyrmions. The magnetic strip includes one or more spatial inhomogeneities configured to generate a skyrmion at known locations when excited by a current pulse. A current pulse generator is used to inject current pulses into the magnetic strip via contact pads electrically coupled to both the current pulse generator and the magnetic strip. The system also includes a magnetic field source to apply an out-of-plane magnetic field across the magnetic strip to facilitate generation of skyrmions. Skyrmions can be generated by applying an out-of-plane magnetic field to the magnetic strip and injecting a current pulse with sufficient current density towards the spatial inhomogeneities. Once a skyrmion is generated, another current pulse with sufficient current density can be injected to move the skyrmion.

21 Claims, 16 Drawing Sheets

(51) Int. Cl.
- H01F 10/32 (2006.01)
- H01L 27/22 (2006.01)
- H01L 43/02 (2006.01)
- H01L 43/10 (2006.01)

(52) U.S. Cl.
CPC ........... *H01F 10/329* (2013.01); *H01L 43/02* (2013.01); *H01L 43/10* (2013.01); *G11C 11/18* (2013.01)

(56) References Cited

U.S. PATENT DOCUMENTS

| | | | |
|---|---|---|---|
| 2016/0276008 A1* | 9/2016 | Saida | G11C 11/1659 |
| 2016/0351242 A1 | 12/2016 | Nagaosa et al. | |
| 2017/0018297 A1* | 1/2017 | Zang | G11C 11/1675 |
| 2017/0076772 A1* | 3/2017 | Andrikopoulos | G11C 11/1673 |
| 2017/0178746 A1* | 6/2017 | Nagaosa | H01L 43/08 |
| 2017/0179375 A1* | 6/2017 | Nagaosa | H01L 43/08 |
| 2017/0206921 A1* | 7/2017 | Nagaosa | G11B 5/02 |
| 2018/0301266 A1* | 10/2018 | Ou | G11C 11/1675 |
| 2019/0074044 A1* | 3/2019 | Atulasimha | G11C 11/1659 |
| 2019/0172998 A1* | 6/2019 | Tan | H01L 43/02 |

OTHER PUBLICATIONS

Brataas et al., Spin-orbit torques in action. Nature Nanotechnology 9, 86-88 (2014).
Büttner et al., Dynamics and inertia of skyrmionic spin structures. Nature Physics 11, 225-228 (2015).
Büttner et al., Field-free deterministic ultrafast creation of magnetic skyrmions by spin-orbit torques. Nat Nanotechnol. Nov. 2017;12(11):1040-1044.
Büttner, Dynamic Imaging with X-ray Holography. In Holographic Materials and Optical Systems, IntechOpen 2017. http://dx.doi.org/10.5772/66689. 19 pages.
Eisebitt et al. Lensless imaging of magnetic nanostructures by X-ray spectro-holography. Nature 432, 885-888 (2004).
Emori et al., Current-driven dynamics of chiral ferromagnetic domain walls. Nature Materials 12, 611-616 (2013).
Fert et al., Skyrmions on the track. Nature Nanotechnology 8, 152-156 (2013).
Garello et al., Ultrafast magnetization switching by spin-orbit torques. Applied Physics Letters 105, 212402 (2014).
Hayashi et al., Quantitative characterization of the spin-orbit torque using harmonic Hall voltage measurements. Physical Review B 89, 144425 (2014). 15 pages.
Hellman et al., Interface-Induced Phenomena in Magnetism. Rev. Mod. Phys. 89, 025006 (2017). 197 pages.
Hrabec et al., Current-induced skyrmion generation and dynamics in symmetric bilayers. Nature Communications. 8. 2017. 12 pages.
Huang et al., Initialization-Free Multilevel States Driven by Spin-Orbit Torque Switching. Advanced Materials 29, 1601575 (2017). 6 pages.
International Search Report and Written Opinion in PCT/US2018/031044 dated Jul. 20, 2018, 9 pages.
Iwasaki et al., Current-induced skyrmion dynamics in constricted geome-tries. Nature Nanotechnology 8, 742-747 (2013).
Jiang et al. Direct observation of the skyrmion Hall effect. Nature Physics 13, 162-169 (2016).
Jiang et al., Blowing magnetic skyrmion bubbles. Science 349, 283-286 (2015).
Jiang, et al., Mobile Néel skyrmions at room temperature: Status and future. AIP Advances, v6 2016. 7 pages.
Khvalkovskiy et al., Matching domain-wall configuration and spin-orbit torques for efficient domain-wall motion. Physical Review B 87 (2013). 5 pages.
Koshibae et al., Memory functions of magnetic skyrmions. Japanese Journal of Applied Physics 54, 053001 (2015). 8 pages.
Lee et al., Threshold current for switching of a perpendicular magnetic layer induced by spin Hall effect. Applied Physics Letters 102, 112410 (2013). 6 pages.
Legrand et al., Room-temperature current-induced generation and motion of sub-100nm skyrmions. Nano Lett. 2017, 17, 2703-2712.
Litzius et al., Skyrmion Hall effect revealed by direct time-resolved X-ray microscopy. Nature Physics 13, 170-175 (2016).
Liu et al., Spin-Torque Switching with the Giant Spin Hall Effect of Tantalum. Science 336, 555-558 (2012).
Moreau-Luchaire et al., Additive interfacial chiral interaction in multilayers for stabilization of small individual skyrmions at room temperature. Nature Nanotechnology 11, 444-448 (2016).
Nagaosa et al., Topological properties and dynamics of magnetic skyrmions. Nature Nanotechnology 8, 899-911 (2013).
Parkin et al., Magnetic Domain-Wall Racetrack Memory. Science 320, 190-194 (2008).
Rohart et al., Skyrmion confinement in ultrathin film nanostructures in the presence of Dzyaloshinskii-Moriya Interaction. Physical Review B 88, 184422 (2013). 8 pages.
Romming et al., Writing and Deleting Single Magnetic Skyrmions. Science 341, 636-639 (2013).
Rosch, Skyrmions: Moving with the current. Nature Nanotechnology 8, 160-161 (2013).
Sampaio et al., Nucleation, stability and current-induced motion of isolated magnetic skyrmions in nanostructures. Nature Nanotechnology 8, 839-844 (2013).
Schott et al., The skyrmion switch: turning magnetic skyrmion bubbles on and off with an electric field. Nano Lett. 2017, 17, 3006-3012.
Sinova et al., Spin Hall effects. Reviews of Modern Physics 87, 1213-1260 (2015).
Slonczewski, Current-driven excitation of magnetic multilayers. Journal of Magnetism and Magnetic Materials 159, L1-L7 (1996). 7 pages.
Tchoe et al., Skyrmion generation by current. Phys. Rev. B, 85(17) 2012. 8 pages.
Vansteenkiste et al. The design and verification of MuMax3. AIP Advances 4, 107133 (2014). 23 pages.
Wiesendanger, Nanoscale magnetic skyrmions in metallic films and multilayers: a new twist for spintronics. Nature Reviews Materials 16044 (2016). 11 pages.
Woo et al., Observation of room-temperature magnetic skyrmions and their current-driven dynamics in ultrathin metallic ferromagnets. Nature Materials 15, 501-506 (2016).
Yu et al., Room-Temperature Skyrmion Shift Device for Memory Application. Nano Lett. Jan. 11, 2017;17(1)261-268.
Yu et al., Variation of Topology in Magnetic Bubbles in a Colossal Magnetoresistive Manganite. Advanced Materials 29, 1603958 (2016). 6 pages.
Zhou et al., A reversible conversion between a skyrmion and a domain-wall pair in a junction geometry. Nature Communications 5, 4652 (2014). 8 pages.

* cited by examiner

METHODS AND APPARATUS FOR MAKING MAGNETIC SKYRMIONS

CROSS-REFERENCE TO RELATED PATENT APPLICATION(S)

This application claims priority, under 35 U.S.C. § 119(e), to U.S. Application No. 62/501,218, which was filed on May 4, 2017, and is incorporated herein by reference in its entirety.

GOVERNMENT SUPPORT

The invention was made with government support under Contract No. DE-SC0012371 awarded by the U.S. Department of Energy. The government has certain rights in the invention.

BACKGROUND

Racetrack memory is a type of non-volatile memory that utilizes magnetic domains, which are regions of uniform electron spin, distributed along a magnetic wire where each domain can store a bit of data. Racetrack memory can potentially provide data transfer speeds that exceed the data transfer rates in hard disk drives (HDDs), solid-state drives (SDDs), and even rapid access memory (RAM) and data storage densities greater than HDDs and SDDs at reduced costs. However, the development of racetrack memory has been hindered by the sensitivity of magnetic domains to defects in the magnetic wire, which can lead to substantial reductions in data transfer speeds.

To overcome the limitations imposed by magnetic domains in racetrack memory, magnetic skyrmions, which are small particle-like domains with a reversed magnetization relative to the bulk magnetization state of a magnetic material, can instead be used to store bits of data. Magnetic skyrmions are insensitive to material defects and can be moved at high speeds to facilitate fast data transfer rates. However, magnetic skyrmions have conventionally been generated using thermal mechanisms, resulting in a random generation of skyrmions in a material over time. This is of limited use for memory devices where bits of data should be generated at known locations in a deterministic manner.

SUMMARY

Embodiments described herein are directed to a system and a method for the deterministic generation of magnetic skyrmions, or skyrmions for short. The system includes a magnetic strip configured to store and transport skyrmions. The magnetic strip includes one or more spatial inhomogeneities configured to generate (herein also referred to as "nucleate") a skyrmion at known locations when excited by a current pulse. A current pulse generator injects current pulses into the magnetic strip via contact pads electrically coupled to both the current pulse generator and the magnetic strip. The system also includes a magnetic field source to apply an out-of-plane magnetic field across the magnetic strip to stabilize skyrmions after generation.

A method for generating skyrmions deterministically is also described and includes: (1) saturating the magnetic strip with an out-of-plane magnetic field from the magnetic field source such that the magnetization in the magnetic strip is uniform, (2) reducing the strength of the out-of-plane magnetic field such that skyrmions are stable once nucleated and do not form skyrmions spontaneously, (3) injecting a current pulse into the magnetic strip and towards a spatial inhomogeneity with a current density amplitude sufficient to generate a skyrmion, and (4) injecting a current pulse into the magnetic strip with a current density amplitude sufficient to move the skyrmion without generating additional skyrmions.

According to some embodiments, a method to create a magnetic skyrmion includes injecting a spin orbit torque current pulse towards a spatial inhomogeneity in a strip of magnetic material such that the magnetic skyrmion is created at the spatial inhomogeneity. The spin orbit torque current pulse can have a pulse duration of less than 10 ns and a peak current density of at least $2.6 \times 10^{11}$ A/m$^2$. The spatial inhomogeneity can either be a constriction in the strip of magnetic material or a region in the strip of magnetic material with magnetic anisotropy. Before the spin orbit torque current pulse is injected, an out of plane magnetic field can be applied to saturate the strip of magnetic material followed by reducing the amplitude of the out of plane magnetic field. The strip of magnetic material can also be heated prior to injecting a spin orbit torque current pulse in order to reduce the current density required to create the magnetic skyrmion. Heating can be accomplished by injecting at least one current pulse can into the strip of magnetic material. Once the spin orbit torque current pulse is injected, one or more current pulses can be injected into the strip of magnetic material to drive the magnetic skyrmion away from the spatial inhomogeneity. Another spin orbit torque current pulse can be injected towards the spatial inhomogeneity in the strip of magnetic material to create another magnetic skyrmion at the spatial inhomogeneity. A magnetic skyrmion can also be driven towards the constriction in the magnetic strip to annihilate the magnetic skymrion.

According to some embodiments, an apparatus to create magnetic skyrmions can include a strip of magnetic material having a spatial inhomogeneity and a current pulse generator, in electrical communication with the strip of magnetic material, to inject a spin orbit torque current pulse toward the spatial inhomogeneity to generate a magnetic skyrmion. The strip of magnetic material can be at least 30% wider than the diameter of the magnetic skyrmion. The spatial inhomogeneity can be a constriction in the strip of magnetic material. The current pulse generator can be configured to generate the spin orbit torque current pulse with a duration of less than ten nanoseconds and a peak current density of at least $2.6 \times 10^{11}$ A/m$^2$. The current pulse generator can be configured to inject at least one current pulse into the strip of magnetic to reduce a current density required to create the magnetic skyrmion before injecting the spin orbit torque current pulse. The current pulse generator can also be configured to inject at least one current pulse into the strip of magnetic to drive the magnetic skyrmion away from the spatial inhomogeneity. The current pulse generator can also be configured to inject another spin orbit torque current pulse towards the spatial inhomogeneity in the strip of magnetic material to create another magnetic skyrmion at the spatial inhomogeneity. The current pulse generator can be configured to drive the magnetic skyrmion towards a constriction in the strip of magnetic to annihilate the magnetic skyrmion. An external magnetic field source, in electromagnetic communication with the strip of magnetic material, can be used to saturate the strip of magnetic material with an out-of-plane magnetic field before the current pulse generator injects the spin orbit torque current pulse.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1:
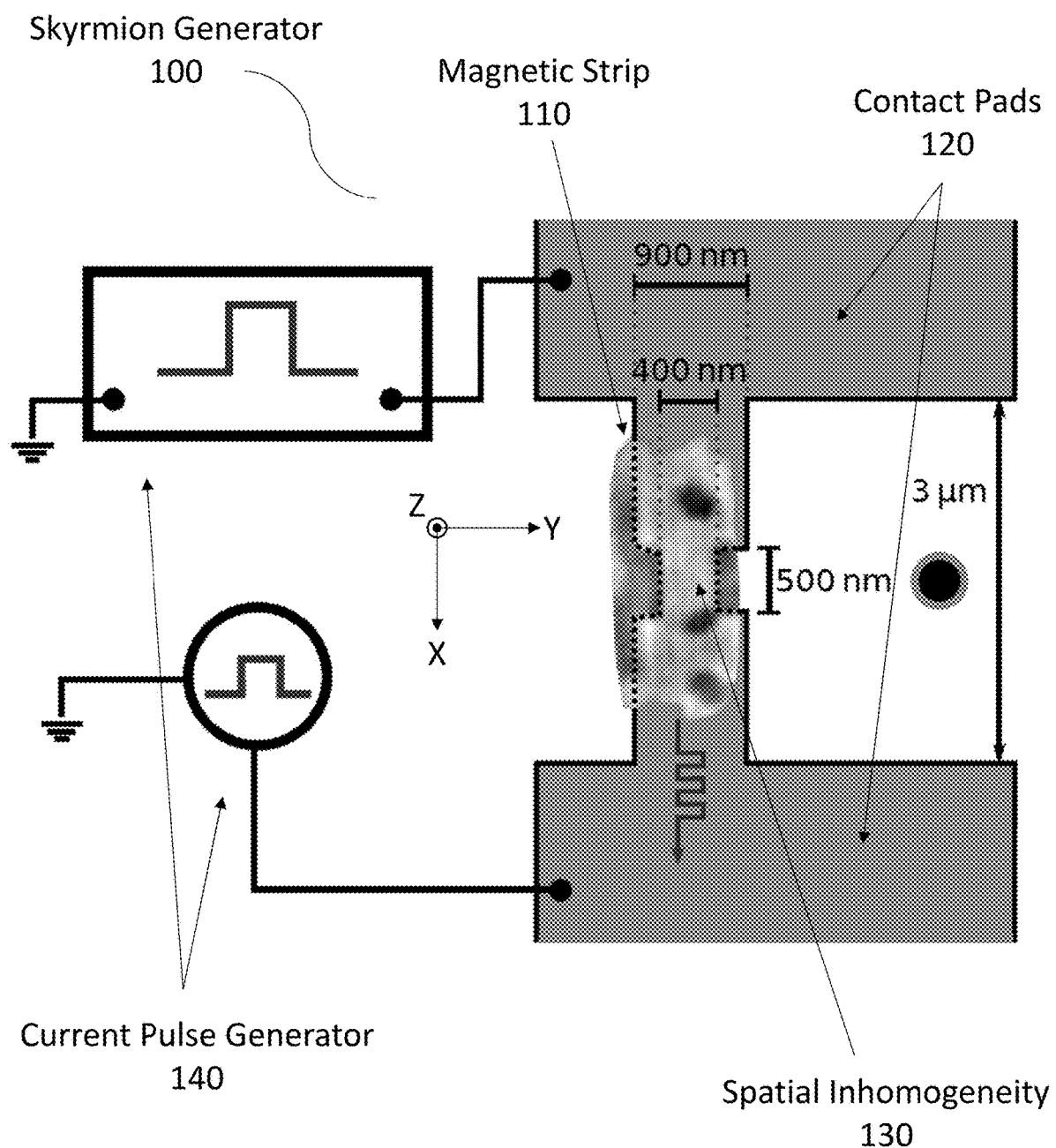
FIG. 1 is a schematic illustration of a magnetic skyrmion generator.

Embodiments described herein are directed to a system and a method for the deterministic generation of magnetic skyrmions. The system can include a magnetic strip that stores and transports magnetic skyrmions. The magnetic strip can include a spatial inhomogeneity configured to generate a magnetic skyrmion at a known location when excited by a current pulse. A current pulse generator can be used to inject current pulses into the magnetic strip via contact pads electrically coupled to both the current pulse generator and the magnetic strip. The system can also include a magnetic field source to apply an out-of-plane magnetic field across the magnetic strip to stabilize generated magnetic skyrmions.

Skyrmions generated in a deterministic manner can be used to store bits of data in a memory device. Skyrmion-based memory devices can potentially provide higher data transfer speeds and greater data storage density compared to conventional storage media, enabling computer systems with advanced central processing units (CPUs) to achieve greater processing power. Conventional storage media, such as hard disk drives (HDD) or solid-state drives (SDD), have been limited by both performance and cost. An HDD utilizes a rapidly rotating magnetic disc platter to store data and a magnetic head to read or write data. The simple mechanical design of a HDD has led to the development of HDDs with large storage capacities at a low cost per bit, but data transfer speeds are limited by the mechanical components used to read or write data. An SDD utilizes transistors to electronically store bits of data. An SDD can provide high data transfer speeds, but the storage capacity is limited by a high cost per bit, which is due, in part, to the expensive fabrication of the transistors in the SDDs.

Racetrack memory is a type of non-volatile memory that utilizes magnetic domains, which are regions of uniform electron spin, distributed along a magnetic wire where each domain can store a bit of data. A spin polarized current pulse can be applied to the magnetic wire to move the magnetic domains along the magnetic wire. Magnetic read or write heads can be positioned in close proximity to the magnetic wire to read or write data as the magnetic domains pass by. One feature of racetrack memory is that the magnetic domains can be moved at such high speeds that data transfer rates can exceed the data transfer rates in HDDs, SDDs, and even rapid access memory (RAM). Furthermore, a single transistor can be used to read and write data to the magnetic wire. Multiple bits of data can be stored per transistor, effectively increasing the density of data stored compared to SDDs, where a single bit of data is stored per transistor, thus reducing the cost per bit.

However, the development of racetrack memory has been hindered by the sensitivity of magnetic domains to defects in the magnetic wire. In particular, when a magnetic domain encounters a defect, such as a grain boundary, surface roughness, dislocation, or stacking fault, the magnetic domain can get stuck on the defect, thus restricting movement. Typically, the defects are micron or sub-micron in size. Current pulses with a long pulse width can be applied to push the magnetic domain past the defect, but the combination of a long pulse width and the restricted motion of magnetic domains results in substantially reduced data transfer speeds.

To overcome the effects of defects in racetrack memory devices, one approach is to utilize magnetic skyrmions to store bits of data instead of magnetic domains. Magnetic skyrmions are small particle-like domains with a reversed magnetization relative to the bulk magnetization state of a magnetic material. Magnetic skyrmions are topologically protected quasiparticles, thus making magnetic skyrmions very stable and insensitive to material defects. Furthermore, magnetic skyrmions can be moved by spin polarized current pulses and can reach high speeds even when defects are present. While magnetic skyrmions exhibit properties beneficial to racetrack memory devices, magnetic skyrmions have conventionally been generated thermally, e.g., by heating up a magnetic material. As a result, magnetic skyrmions are generated randomly within the magnetic material over time, which is of limited use for memory devices where bits of data should be generated at known locations in a deterministic manner.

The inventors have thus recognized a desire to deterministically generate magnetic skyrmions at a known location and time. The present disclosure thus describes a system and a method to deterministically generate magnetic skyrmions. Material systems that exhibit a large Dzyaloshinskii-Moriya interaction (DMI) can generate homochiral and defect-free magnetic skyrmions in response to an injected current pulse such that a spin orbit torque (SOT) is generated, in combination with a non-uniform magnetic material. Conventionally, an in-plane magnetic field is used to deterministically orient the magnetization, e.g., to switch the direction of the magnetization in a ferromagnetic material and thus the bit value stored in the ferromagnetic material. However, the combination of the DMI and the material non-uniformity can enable deterministic switching of the magnetization without an in-plane field, thus simplifying the design for a skyrmion generator.

A spatial inhomogeneity can be introduced controllably into the material system, e.g., by patterning or local ion irradiation, to generate skyrmions at known locations within the material system. A current pulse can be injected into the material system to switch the magnetization locally near the spatial inhomogeneity, which results in the formation of a skyrmion once the domain of reversed magnetization is separated from the spatial inhomogeneity. Additionally, a weaker current pulse can also be used to drive the motion of skyrmions in a deterministic manner. By including mechanisms to both generate and move skyrmions, the skyrmion generator can be used to write bits of data in a memory device.

An exemplary embodiment of a magnetic skyrmion generator 100 is shown in FIG. 1. The skyrmion generator 100 can include a magnetic strip 110 configured to support the transport and storage of magnetic skyrmions. The magnetic strip 110 can have a shape that is substantially one-dimensional, e.g., a wire with a cross sectional area, such that skyrmions are constrained to move along the one-dimensional magnetic strip 110. The width of the magnetic strip 110, along the y-direction shown in FIG. 1, can be further dimensioned to be at least 30% wider than the diameter of a skyrmion to ensure skyrmions can propagate along the magnetic strip 110 in the x-direction. The magnetic strip 110 can also have a shape that is substantially two-dimensional, e.g., a planar thin film, or a three-dimensional solid.

The magnetic strip 110 can include a spatial inhomogeneity 130 configured to generate a skyrmion when excited by a current pulse with sufficient current density. The magnetic strip 110 can be further positioned between two or more contact pads 120. The contact pads 120 can be electrically coupled to the magnetic strip 110 and a current pulse generator 140 to facilitate the injection of current pulses generated by the current pulse generator 140 into the magnetic strip 110. In some embodiments, the magnetic strip 110 and the contact pads 120 can be formed from the same material to simplify manufacture and improve electrical coupling.

The magnetic strip 110 can be further supported by a substrate (not shown) to facilitate handling and manufacture of the magnetic strip 110. The substrate can be formed from a non-magnetic material to reduce unwanted interactions between the substrate and the skyrmion generator 100. The skyrmion generator 100 can also include a magnetic field source 150 configured to apply an out-of-plane magnetic field across the magnetic strip 110 to prepare the magnetic strip 110 for skyrmion generation and to stabilize skyrmions once generated.

Magnetic Strip Design

The magnetic strip 110 can be formed from a multilayer structure with one or more pairs of a ferromagnetic layer and a non-magnetic heavy metal layer in contact with one another. The interface between the ferromagnetic layer and the non-magnetic heavy metal layer can be configured to support a large DMI to generate skyrmions. The non-magnetic heavy metal layer can also be configured to be a SOT source to facilitate generation and transport of skyrmions. SOTs can be generated within the non-magnetic heavy metal layer by the spin Hall effect (SHE) when the non-magnetic heavy metal layer is initially magnetized and subjected to a current pulse. The ferromagnetic layer can be $Co_{60}Fe_{20}B_{20}$ and the non-magnetic heavy metal layer can be Pt. The ferromagnetic layer and the non-magnetic heavy metal layer can be sufficiently thin such that interfacial effects are dominant with respect to the bulk properties of each layer. In this manner, the effects of the DMI and the SOT source can more reliably generate and transport skyrmions.

Figure 2:
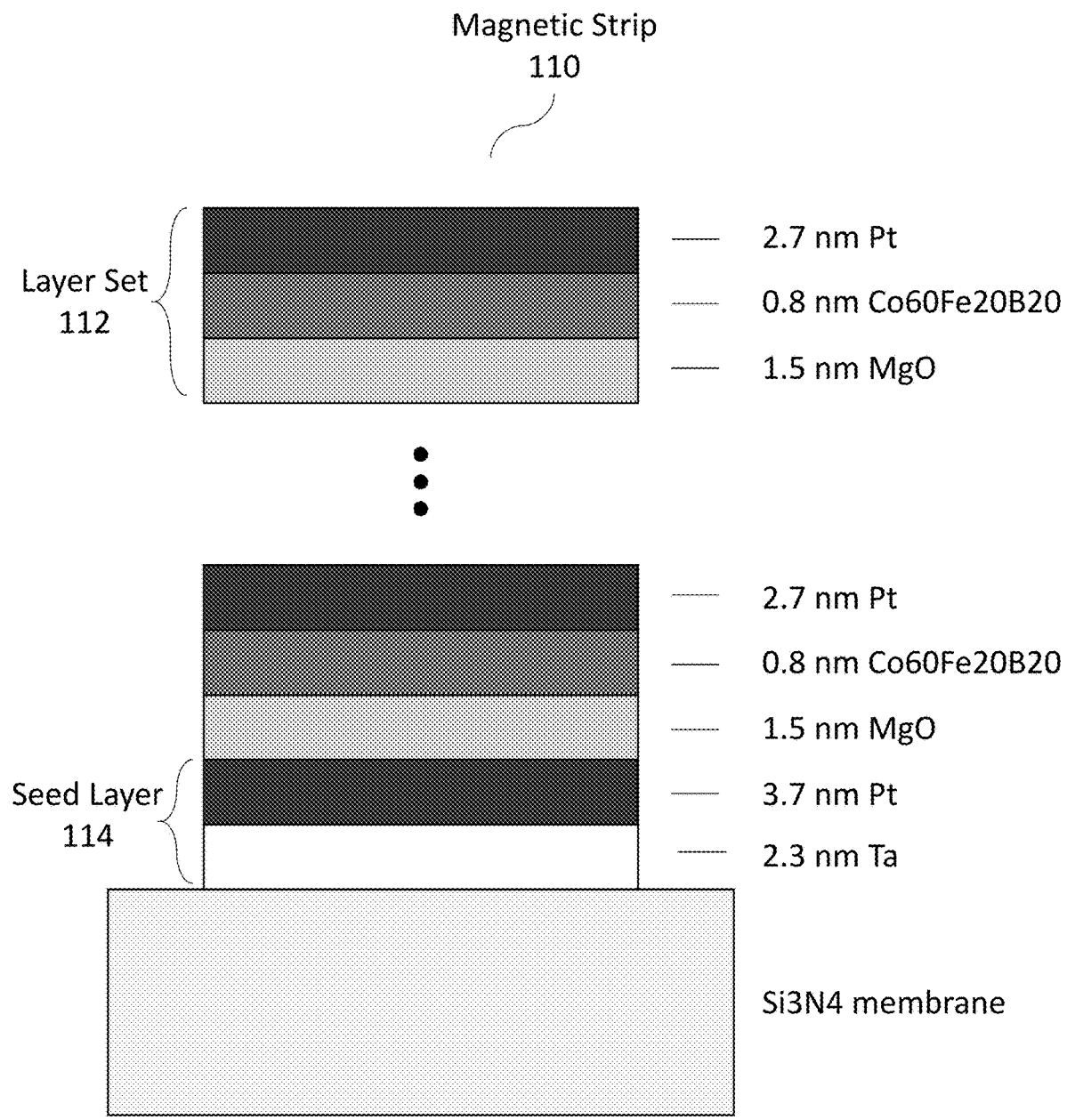
FIG. 2 is a schematic illustration detailing the structure of a magnetic strip.

According to an exemplary embodiment shown in FIG. 2, the magnetic strip 110 can be formed from 15 repeating sets of layers 112 that include, from top to bottom, 2.7 nm thick Pt, 0.8 nm thick $Co_{60}Fe_{20}B_{20}$, and 1.5 nm thick MgO grown along the z-direction on a $Si_3N_4$ membrane. The MgO layer is used to break the symmetry of the multilayer structure along the z-direction, e.g., it avoids alternating layers of Pt and $Co_{60}Fe_{20}B_{20}$, in order to provide conditions for DMI and SOT to occur. The $Si_3N_4$ membrane is coated with 2.3 nm thick Ta followed by 3.7 nm thick Pt to form a seed layer 114 to facilitate the growth of subsequent layers for the magnetic strip 110. A portion of the deposited layers can be removed to form a narrow strip, corresponding to the magnetic strip 110, which constrains the motion of magnetic skyrmions along the length of the strip. For example, the magnetic strip 110 can be approximately 900 nm wide and 3 μm long according to the exemplary embodiment shown in FIG. 1. By forming the magnetic strip 110 in this manner, the remaining portions of the deposited layers at the ends of the magnetic strip 110 can be used as contact pads 120. The magnetic strip 110 can be manufactured using various patterning processes, including, but not limited to, photolithography, e-beam lithography, interference lithography, and focus ion beam milling, and various deposition/growth processes including, but not limited to, sputtering, e-beam evaporation, chemical vapor deposition, atomic layer deposition, and pulsed laser deposition. The manufacturing methods can further be compatible with complementary metal-oxide-semiconductor (CMOS) processes.

Spatial Inhomogeneity

The spatial inhomogeneity 130 can be used to deterministically generate skyrmions at a known location in the magnetic strip 110. The spatial inhomogeneity 130 can include any of a variety of material and structural features in the magnetic strip 110. The spatial inhomogeneity 130 can also be introduced by local variations in the magnetic properties of the magnetic strip 110. In particular, regions where the magnetic anisotropy varies can be used to generate magnetic skyrmions. Variations in magnetic anisotropy can be achieved using various methods including, but not limited to, local ion irradiation, voltage controlled magnetic anisotropy, local stress or strain, or ionic gating. Material features can include, but are not limited to, grain boundaries, dislocations, stacking faults, and regions of material damaged during processing. The magnetic strip 110 can include randomly distributed material features, e.g., various grain boundaries in a film with polycrystalline morphology, due to the processed used for manufacture.

Figure 3:
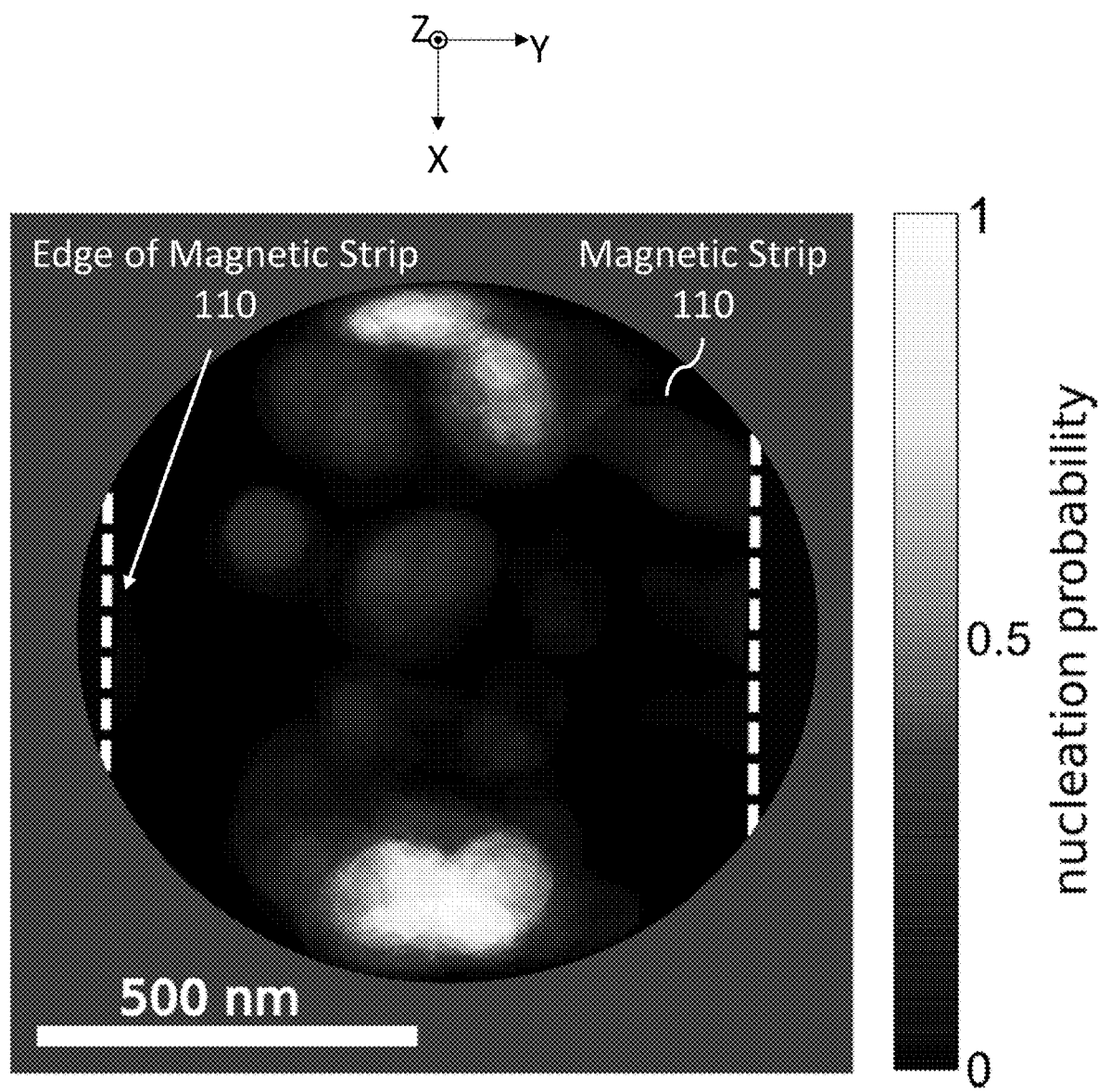
FIG. 3 is a probability map of magnetic skyrmion generation due to material features as a function of location on the magnetic strip.

FIG. 3 shows a probability map detailing the probability skyrmions are generated at a particular location for a portion of an exemplary magnetic strip 110. As shown in FIG. 3, the generation of skyrmions can be highly localized to certain regions of the magnetic strip 110, which can indicate the positions of spatial inhomogeneities 130. The spatial inhomogeneities 130 in FIG. 3 are naturally occurring, thus the strength, size, and position of the spatial inhomogeneities 130 are random. The occurrence of random material features can be reduced by utilizing lattice-matched materials and by using growth temperatures that allow atoms to rearrange and form a more crystalline morphology.

Material features can be deterministically placed along the magnetic strip 110 using various methods. For example, the magnetic strip 110 can be manufactured with stacking faults positioned at a predetermined location. A focus ion beam can also be used to implant ions at a particular location, thus damaging a portion of the magnetic strip 110 that then functions as a spatial inhomogeneity 130. Patterned thin films of material can also be deposited onto the magnetic strip 110, where the materials can be configured to affect the DMI and SOT effects described above.

Figure 4:
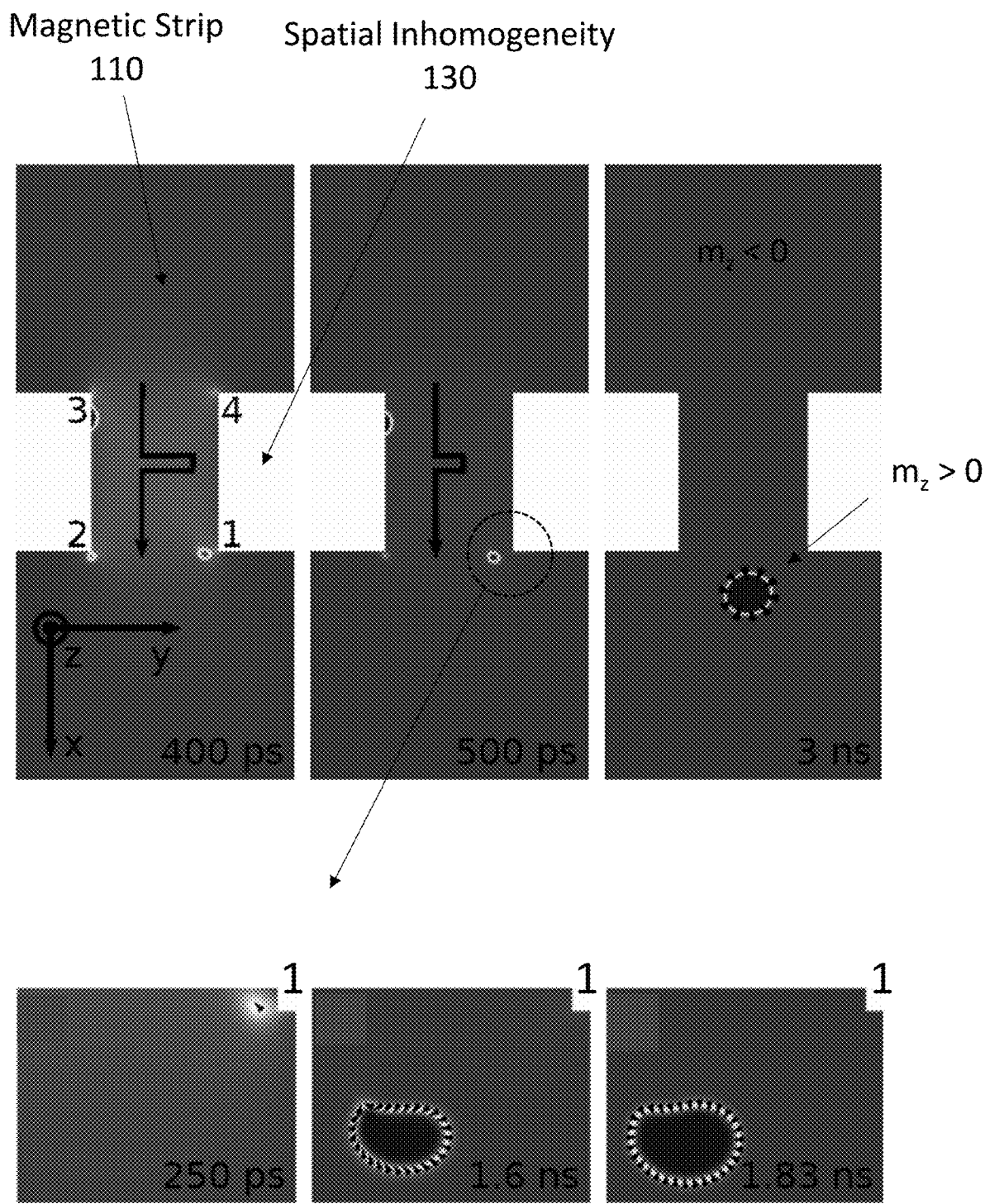
FIG. 4 is a magnetization map for a magnetic strip with a constriction for various times following initial magnetic domain formation.

Structural features can include, but are not limited to, constrictions, notches, holes, and any other features that cause a deviation from the straight track formed by the magnetic strip 110. In some embodiments, a structural feature can include one or more corners, which can function as spatial inhomogeneities 130 where skyrmions are generated. Round features can also be used for magnetic skyrmion generation; however, a more point-like corner or notch provides better performance to generate magnetic skyrmions. An exemplary rectangular constriction is shown in FIG. 4, with four corners. As shown, domains of reversed magnetization can form at corners 1, 2, and 3 due to higher current densities localized at the corners. Domains of reversed magnetization do not form at corner 4 because the flow of current along the positive x-direction transitions from a small current density, e.g., the wider portion of the magnetic strip 110, to an area of large current density, e.g., the narrower portion of the magnetic strip 110, which is unfavorable for switching. A higher current density can be applied to switch the magnetization at corner 4.

As shown in FIG. 4, domains of reversed magnetization can form at the corners of the constriction due to locally increased current densities in these regions. However, the domain walls move in the direction of current in materials where the magnetic layers are above the Pt layers. Therefore, domains at corners 1 and 2 move into the wide part of the magnetic strip 110 while domains nucleated at corners 3 and 4 remain in the constricted part of the magnetic strip 110 for sufficiently short current pulses. After the current pulse, domains in the constricted part of the magnetic strip 110 become unstable and annihilate while domains originating from corners 1 and 2 can transform into skyrmions. In the particular example of FIG. 4, the domain at corner 2 is slightly less stable than the domain at corner 1, which can be utilized to destabilize this domain and to obtain a single skyrmion after a pulse of suitable strength and duration.

Triangular-shaped notches with one corner that functions as a single spatial inhomogeneity 130 can be used reduce uncertainties related to the precise location of skyrmion generation. These notches and other structural features can be manufactured by patterning the magnetic strip 110 using various patterning methods, including, but not limited to, photolithography, e-beam lithography, interference lithography, and focus ion beam milling.

Structural features can also locally narrow regions of the magnetic strip 110 that repel or annihilate incident skyrmions. The narrower regions of the magnetic strip 110 should be dimensioned to be comparable to the size of a skyrmion or smaller. For example, constrictions can be incorporated at the ends of a magnetic strip 110 to repel skyrmions, thus preventing data loss due to skyrmions leaking into the contact pads 120. The magnetic strip 110 may also be sufficiently wide to allow skyrmions to pass through. For example, constrictions can be incorporated along the length of the magnetic strip 110 to generate skyrmions, and hence, write data, at locations other than the ends of the magnetic strip 110. Furthermore, the magnetic strip 110 can include spatial inhomogeneities 130 placed at various locations along the magnetic strip 110.

Current Pulse Generator

The current pulse generator 140 can generate one or more current pulses that are injected into the magnetic strip 110 to facilitate the generation and movement of skyrmions. The current pulses generated by the current pulse generator 140 can have a nominal current density amplitude and a pulse width. A variable time delay can also be introduced between current pulses. The current pulses can further be various types of waveforms including, but not limited to, square waves, rectangular waves, sine waves, sawtooth waves, and triangular waves. The current pulse generator 140 can include electrical leads coupled to the contact pads 120 in order to electrically connect the current pulse generator 140 to the magnetic strip 110. The electrical leads can be removable probes placed in contact with the contact pads 120 or permanent interconnects such as wire-bonded leads. The current pulse generator 140 can be any type of electronic devices or circuitry capable of generating electrical pulses, such as a function generator.

Magnetic Field Source

The magnetic field source 150 can be used to generate an out-of-plane magnetic field on the magnetic strip 110. The out-of-plane magnetic field can have an amplitude controlled by the magnetic field source 150. The magnetic field source 150 can be configured to generate an out-of-plane magnetic field with an amplitude sufficient to initially saturate the magnetic strip 110 in order to make the out-of-plane magnetization in the magnetic strip 110 uniform prior to skyrmion generation. Once the magnetization of the magnetic strip 110 is uniform, the amplitude of the out-of-plane magnetic field can be reduced such that magnetic domains only form when current pulses are injected into the magnetic strip 110. The magnetic field source 150 can surround at least a portion of the magnetic strip 110. The magnetic field source 150 can be various types of devices configured to generate magnetic fields, including, but not limited to, an array of magnetized elements or a solenoid.

Skyrmion Generation Methodology

Figure 5:
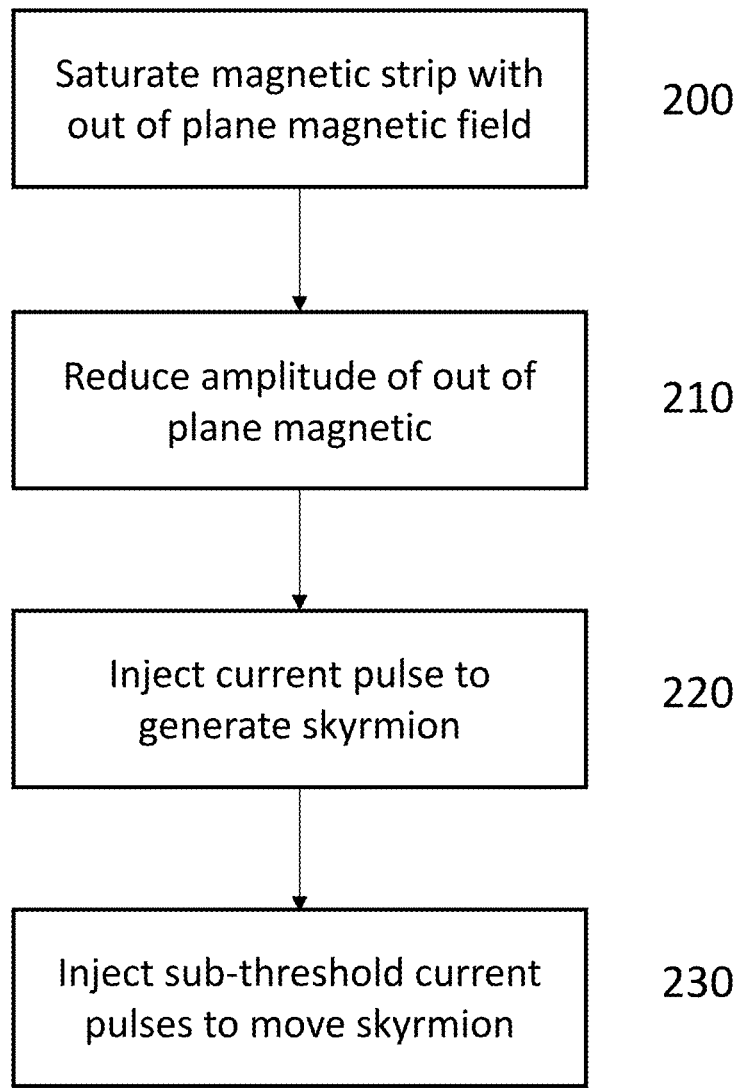
FIG. 5 is a flow chart for a method to generate skyrmions.

As described above, the skyrmion generator 100 can be configured to deterministically generate skyrmions using a current pulse applied to a spatial inhomogeneity 130. Once a skyrmion has been generated, a weaker current pulse can be injected with a current density amplitude sufficient to move the skyrmion without generating a new skyrmion in the process. As shown in FIG. 5, a method of generating skyrmions based on the skyrmion generator 100 can be comprised of the following steps: (1) saturating the magnetic strip 110 with an out-of-plane magnetic field from the magnetic field source 150 such that magnetization in the magnetic strip 110 is uniform 200, (2) reducing the strength of the out of phase magnetic field such that skyrmions are not formed spontaneously, but can be stabilized once nucleated 210, (3) injecting a current pulse into the magnetic strip 110 and towards a spatial inhomogeneity 130 with a current density amplitude sufficient to generate a skyrmion 220, and (4) injecting a current pulse into the magnetic strip 110 with a current density amplitude sufficient to move the skyrmion without generating additional skyrmions 230.

Figure 6:
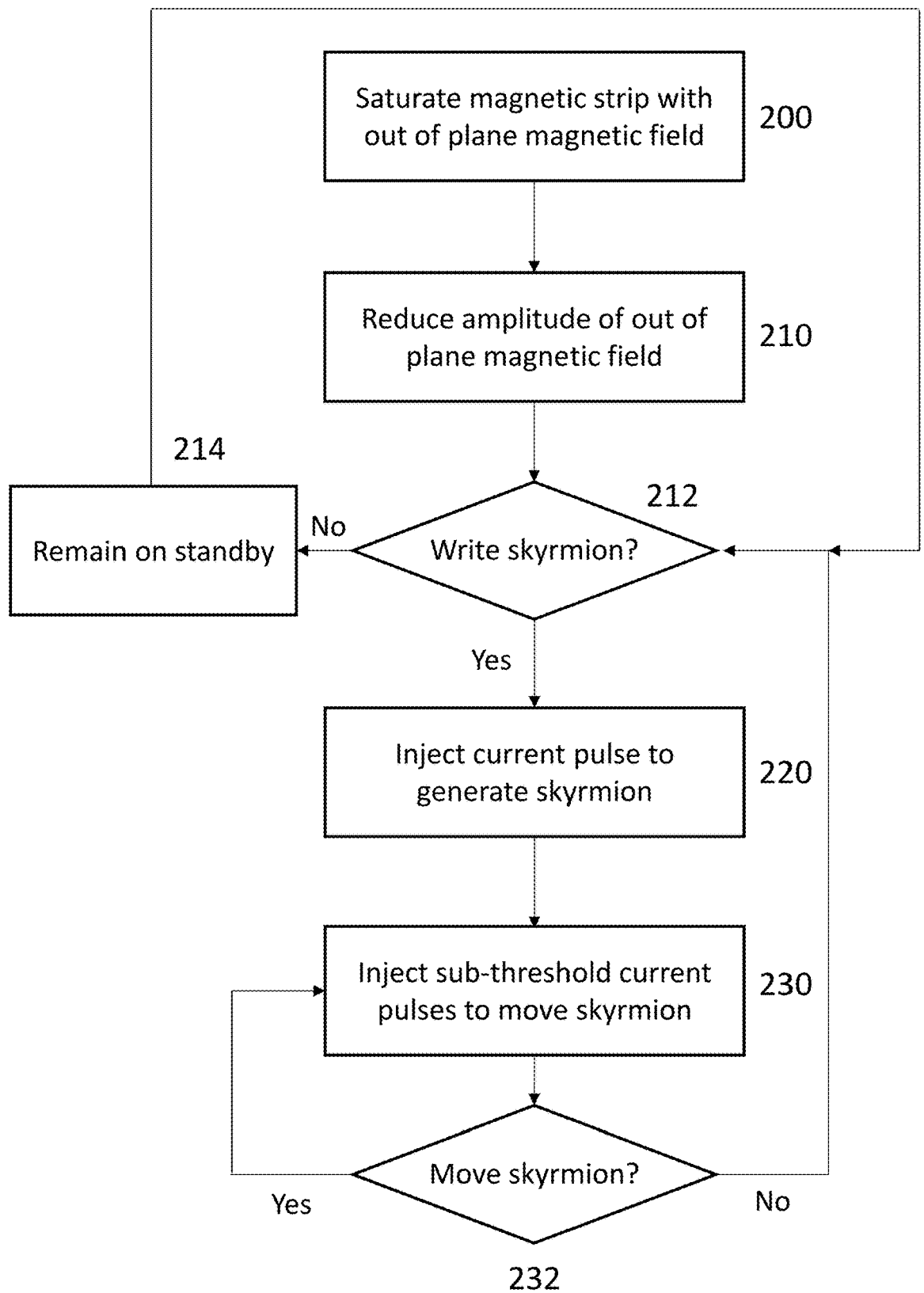
FIG. 6 is a flow chart for a method to generate a sequence of magnetic skyrmions based on the method shown in FIG. 5.

The method of generating skyrmions can also include query steps, such as a write skyrmion 212 and a move skyrmion 232, as shown in FIG. 6. The query steps can be used to apply one or more skyrmion generation or skyrmion movement steps to create a sequence of skyrmions that represent a sequence of bits. For example, a first skyrmion representing a bit value of 1 is generated and moved away from the spatial inhomogeneity 130 using processes 210, 220 and 230. If the next bit value should be 0, the first skyrmion can again be moved using processes 232 and 230, thus creating a region on the magnetic strip with no skyrmion, thus representing a bit value of '0'.

The out-of-plane magnetic field emitted by the magnetic field source 150 has an amplitude sufficient to saturate the magnetic strip 110 such that a uniform out-of-plane magnetization in the magnetic strip 110 is formed. In this manner, skyrmions present in the magnetic strip 110 prior to process 200 are erased. The out-of-plane magnetic field in process 210 can have an amplitude lower than the amplitude of the magnetic field used in process 200 and sufficient to stabilize the generated skyrmions. The amplitude of the magnetic field will vary depending on the material used to form the magnetic strip 110, geometric confinement, and the skyrmion size.

Figure 7:
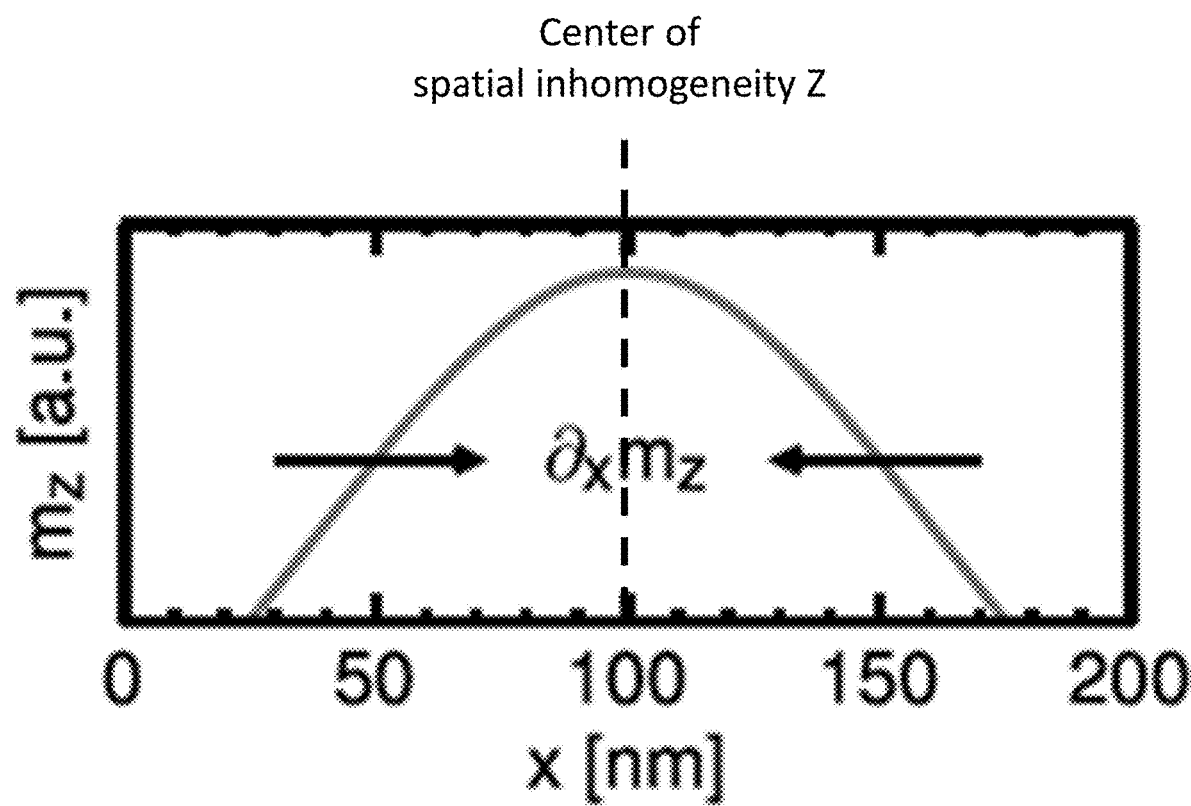
FIG. 7 is an exemplary plot of the out-of-plane magnetization, $m_z$, as a function of position along a cross section of a spatial inhomogeneity excited by a current pulse.

As described above, one or more current pulses, generated by the current pulse generator 140, can be injected into the magnetic strip 110 to generate or move skyrmions. The mechanism to generate a skyrmion is based on the interaction between the current pulse and a spatial inhomogeneity 130. Changes in the out-of-plane magnetization, $m_z$, are largest inside the spatial inhomogeneity 130, as shown in FIG. 7, when a current pulse is injected with SOT, but prior to the generation of a skyrmion. The change in $m_z$ in conjunction with the DMI in the magnetic strip 110 results in the generation of a field $$H_{DMI} = \frac{(-2D_i)}{M_S}(\partial_x m_z, \partial_y m_z, -\partial_x m_x - \partial_y \partial_y),$$

where $D_i$ describes the strength of the DMI and $M_s$ is a saturation magnetization. For the case where $m_z$ is initially negative and $D_i$ is negative, e.g., for Pt below the ferromagnetic layers, and a current pulse in injected along the positive x-direction, the field $H_{DMI}$ includes a negative x field component and a positive y field component in the positive-x and negative-y corner of the spatial inhomogeneity 130, which satisfies conditions to switch magnetization when a current pulse is injected along the positive x-direction in a material with positive spin Hall angle, e.g., for materials with Pt below the ferromagnetic layer. For a current pulse injected along the x-direction, $H_{DMI}$ should include a field component along the x-direction for SOT-induced switching and a field component along the y-direction to compensate field-like SOT. The x and y field components needed to satisfy these condition will always be present around the spatial inhomogeneity 130 if the current density is sufficiently high; hence, switching can always occur with a spatial inhomogeneity 130.

To generate a skyrmion, the current pulse generator 140 injects a current pulse 310 with a short pulse width and a high current density amplitude to generate a magnetic domain with a reversed magnetization within the spatial inhomogeneity 130. The combination of the current density amplitude and the pulse width should exceed a threshold curve for skyrmion generation, where the threshold curve varies depending on the material used to form the magnetic strip 110. Once the magnetic domain forms, a current pulse 320 with a long pulse width and low current density amplitude can be injected to move the domain away from the spatial inhomogeneity 130. The current density amplitude can be approximately $2 \times 10^{11}$ A/m$^2$, which is sufficient to move skyrmions. At lower current densities, the skyrmions remain pinned. For pulse widths less than 10 ns, a large range of current amplitude densities can be used to move skyrmions without generating new skyrmions in the process.

Figure 8:
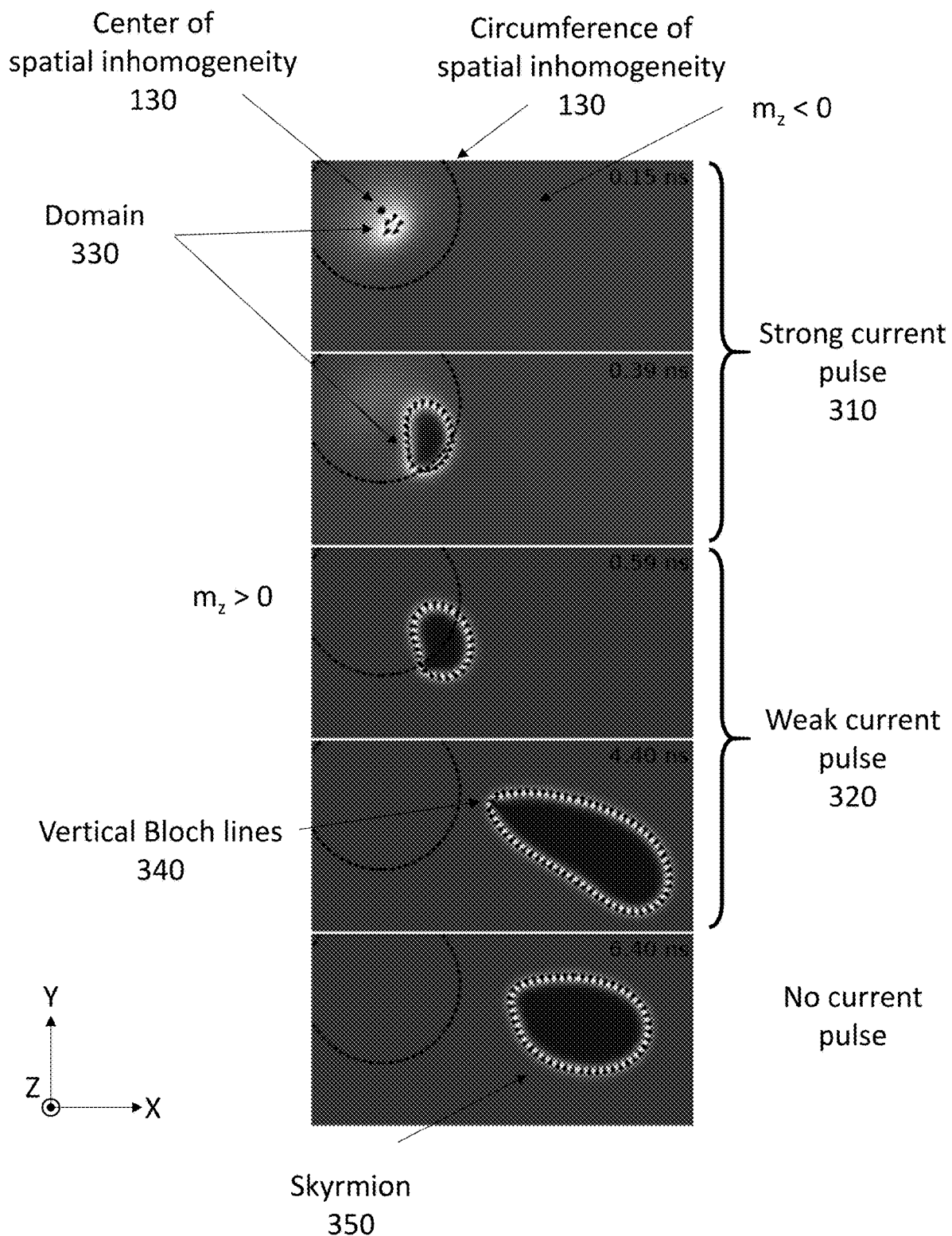
FIG. 8 is a series of exemplary magnetization maps detailing the formation of a magnetic skyrmion from a spatial inhomogeneity as a function of time.

An exemplary illustration of the generation process is shown in FIG. 8. At times between 0 ns and 0.39 ns, the short pulse width, high amplitude current pulse 310 is applied, thus generating a domain 330. The domain 330 is initially not a skyrmion because it is non-topological. Once the long pulse width, low amplitude current pulse 320 is applied at times between 0.39 ns and 4.4 ns, the domain 330 is moved away from the spatial inhomogeneity 130, resulting in a substantially inwards pointing magnetization with a pair of vertical Bloch lines (VBL) 340. The inwards pointing magnetization occurs when $m_z$ is initially negative and $D_i$ is negative or both $m_z$ and $D_i$ are positive. If either $m_z$ or $D_i$ are positive and the other parameter is negative, the domain would exhibit a substantially outwards pointing magnetization. For the exemplary illustration in FIG. 8, the VBL's are regions where the magnetization are not pointing inwards. At these times, the domain 330 is not a skyrmions as the domain 330 still remains non-topological due to the VBL's 340. At time 6.4 ns, the current is turned off and the VBL's 340 are expelled, resulting in a domain 330 with a complete inwards pointing magnetization. The domain 330 thus becomes a skyrmion 350 and is therefore topologically protected.

Figure 9:
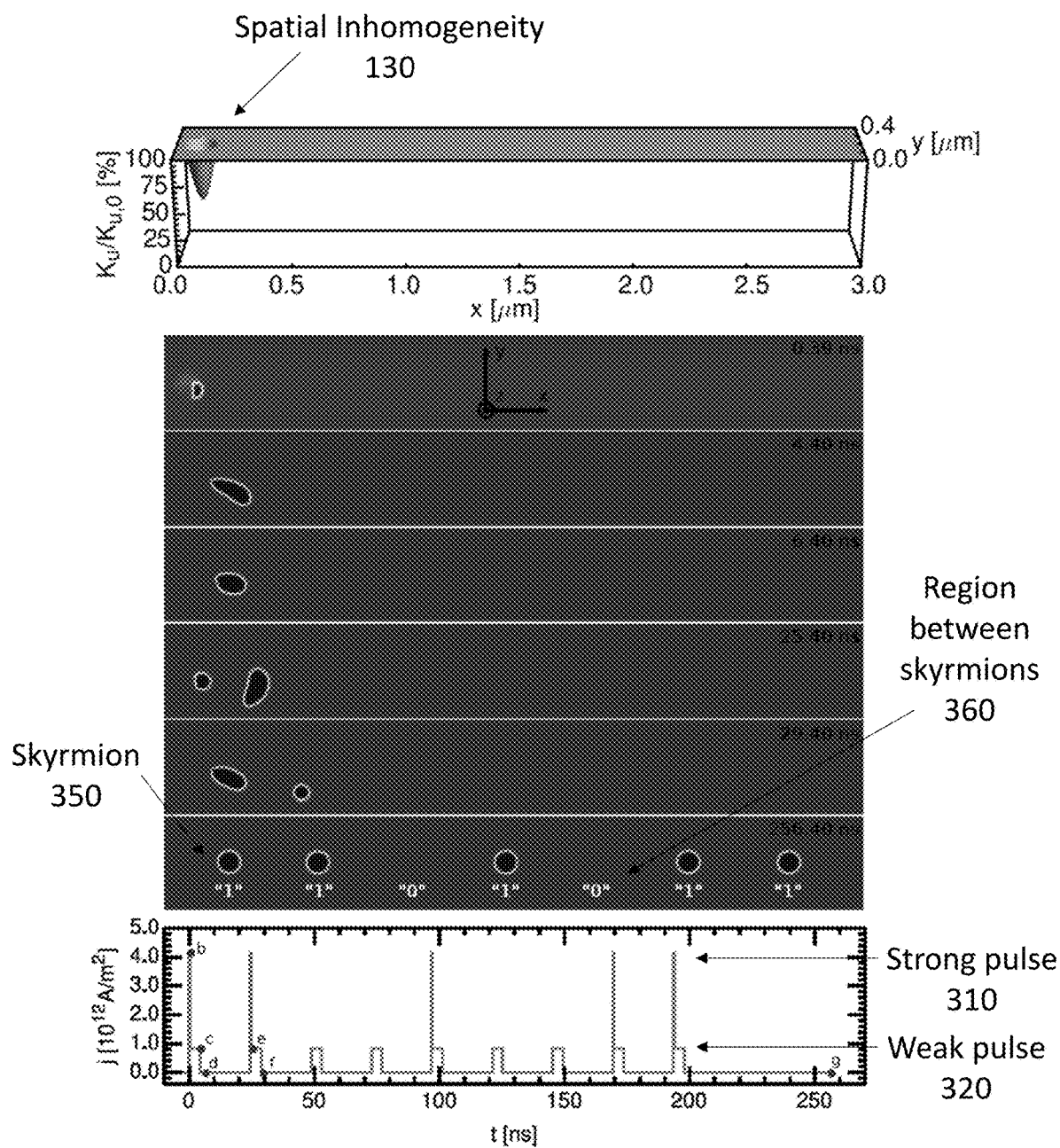
FIG. 9 shows an exemplary sequence of magnetic skyrmions generated from a spatial inhomogeneity due to a series of current pulses configured to generate and move magnetic skyrmions.

In this manner, a combination of high and low amplitude current pulses with variable pulse widths can be injected serially towards a spatial inhomogeneity 130 to write bits of data into the magnetic strip 110. An exemplary demonstration of this concept is shown in FIG. 9 where a spatial inhomogeneity 130 is positioned near x=0 µm. The spatial inhomogeneity 130 is formed by varying the magnetic anisotropy. A series of high amplitude current pulses 310 and low amplitude current pulses 320 are injected at x=0 to form a sequence of skyrmions 350 that move in the positive x-direction. In this configuration, the skyrmions 350 and the regions between the skyrmions 360 correspond to bit values of 1 and 0, respectively. FIG. 9 also shows that once skyrmions 350 are generated, subsequent current pulses can move the skyrmions 350 in the negative y-direction due to a skyrmion Hall effect. To prevent skyrmions 350 from colliding with the edge of the magnetic strip 110, the current can be briefly turned off, e.g., for 20 ns, to allow the skyrmions 350 to return to the center of the magnetic strip 110.

Figure 10:
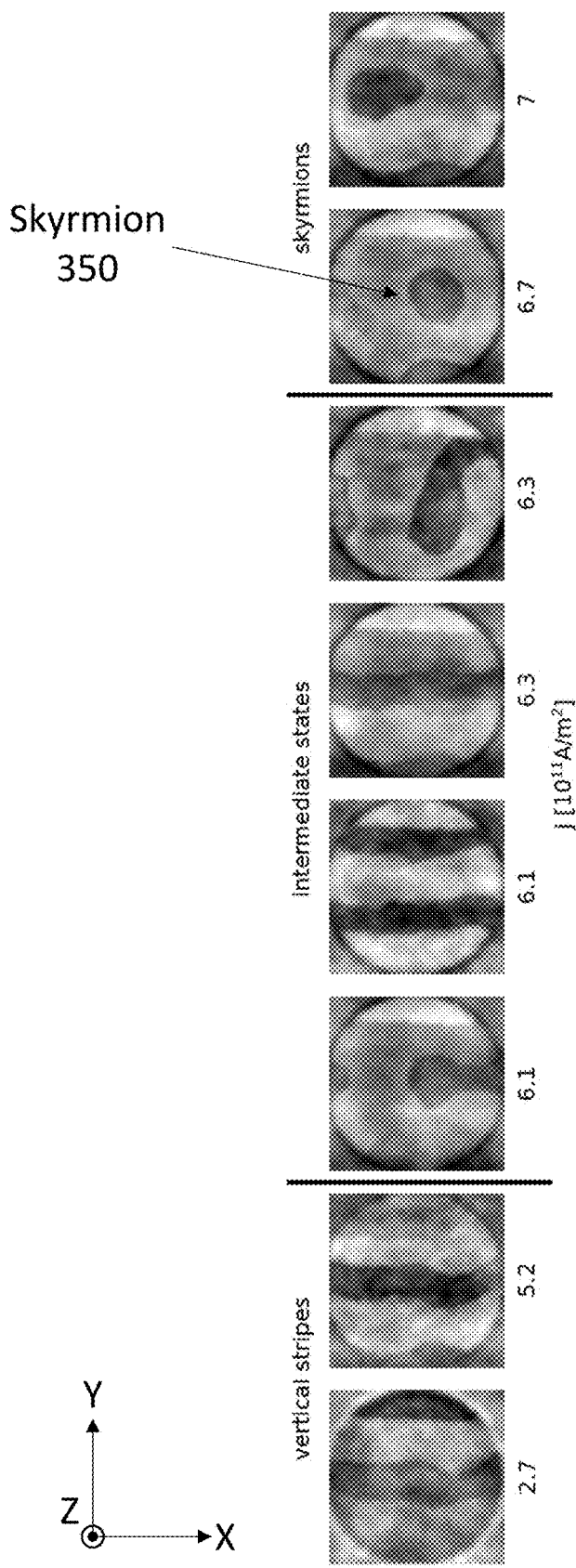
FIG. 10 shows a series of images detailing the formation of magnetic domains in a magnetic strip as a function of the current density amplitude after millions of current pulses are injected to emulate a continuous current source.

The current pulses used in processes 220 and 230 have a nominal current density amplitude and a pulse width, the values of which can affect the generation and movement of skyrmions 350. In process 220, the current density amplitude can dictate the generation of skyrmions 350 in the magnetic strip 110. For example, FIG. 10 shows an exemplary series of images of a magnetic strip 110 acquired at various current density amplitudes after millions of strong current pulses were injected to emulate a continuous current source. When the current density amplitude is small, e.g., equal to or below $5.2 \times 10^{11}$ A/m$^2$ stripe domains form, which are oriented parallel to the injected current along the x-direction. As the current density amplitude increases, e.g., from $6.1 \times 10^{11}$ A/m$^2$ to $6.3 \times 10^{11}$ A/m$^2$ intermediate states, which are a mixture of skyrmions 350 and stripe domains, appear. At sufficiently high current density amplitudes, e.g., greater than or equal to $6.7 \times 10^{11}$ A/m$^2$, skyrmions 350 are generated. The threshold current density amplitude, $j_c$, varies depending on the material and geometry of the magnetic strip 110 and the spatial inhomogeneity 130. For the exemplary embodiment described above where the magnetic strip 110 is a 900 nm wide, 3 μm long multilayer structure with 15 sets of layers 2.7 nm thick Pt, 0.8 nm thick $Co_{60}Fe_{20}B_{20}$, and 1.5 nm thick MgO, $j_c$ is approximately $6.5 \times 10^{11}$ A/m$^2$ for a continuous current source.

Figure 11A:
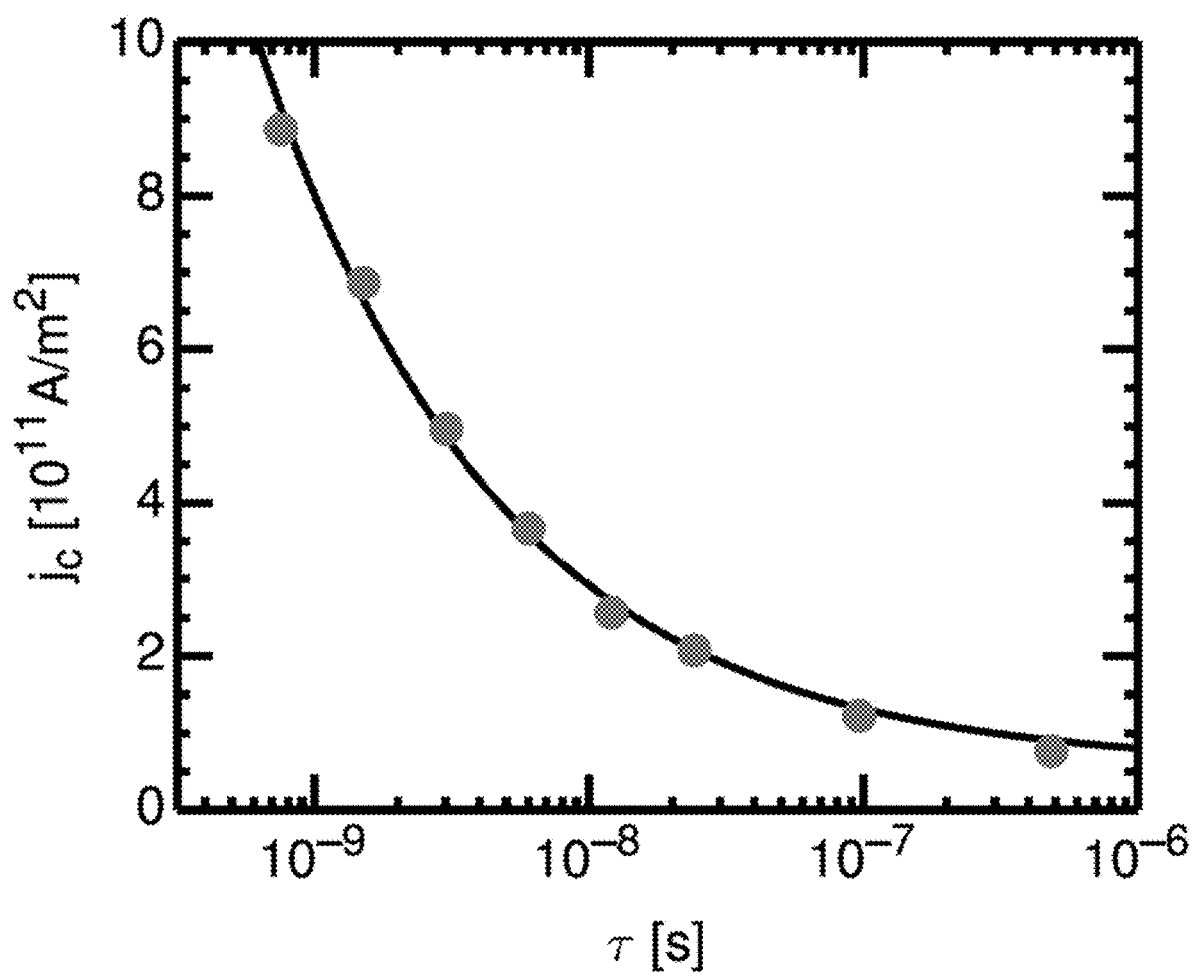
FIG. 11A is a plot of the threshold current density amplitude, $j_c$, as a function of the current pulse width, $\tau$.

In cases where a single current pulse is injected in to the magnetic strip 110, the threshold current density amplitude can vary as a function of the pulse width, τ. As shown in FIG. 11A, the threshold current density amplitude can decrease as the pulse width becomes longer. In the short pulse width regime, e.g., τ less than 10 ns, the threshold current density amplitude can decrease rapidly as the pulse width increases due to a minimum time-integrated injected angular momentum for magnetization switching. However, in addition to providing angular momentum the SOT effect of the current also compensates the material-dependent effective out-of-plane field. The threshold current density therefore saturates at the current density where the damping-like SOT field equals the effective out-of-plane field. In the long pulse width regime, e.g., τ greater than 10 ns, $j_c$ continues to decrease due to thermal effects, e.g., Joule heating, which can assist with magnetization switching. Thermal effects can also accumulate over time as one or more current pulses are injected into the magnetic strip 110.

Figure 11B:
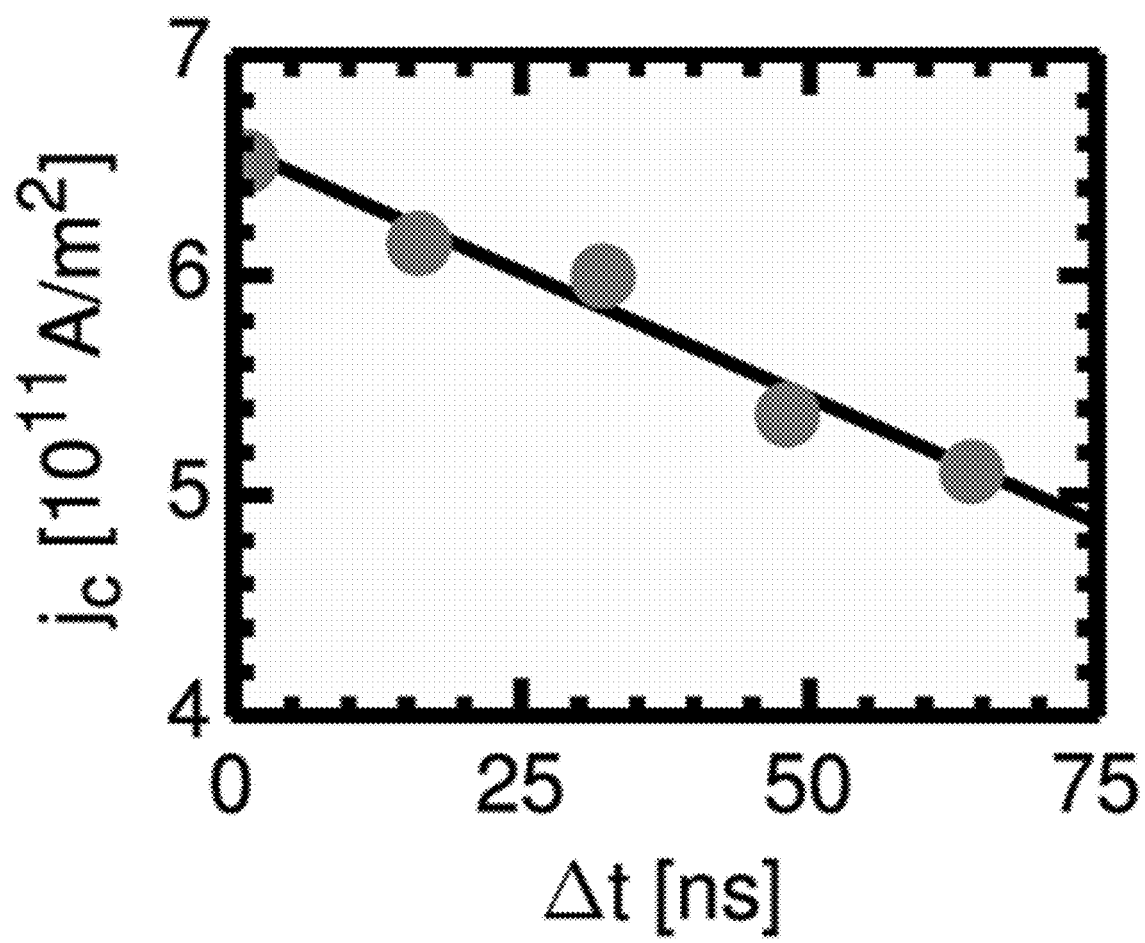
FIG. 11B is a plot of the threshold current density amplitude, $j_c$, as a function of a time delay between a series of current pulses with a short pulse width and a high amplitude superimposed onto a series of current pulses with a long pulse width and a low amplitude for heating.

FIG. 11B shows the threshold current density amplitude decreases as a function of a time delay. The time delay corresponds to the time between a series of current pulses with a variable amplitude and a short pulse width, which are superimposed onto current pulses with a low amplitude and a long pulse width to heat the magnetic strip 110. For longer time delays, the magnetic strip 110 can be heated to higher temperatures. At higher temperatures, thermally-assisted magnetization switching can become stronger, resulting in a decrease in the threshold current density amplitude.

Low amplitude current pulses 320 can also be injected into the magnetic strip 110 to move skyrmions 350 in process 230. In order to move skyrmions 350 without generating new skyrmions during the process, the current density amplitude of the current pulses in process 230 can be below the threshold current density amplitude for skyrmion generation. However, the amplitude of the current pulses in process 230 should remain sufficiently high to induce skyrmion motion for a particular material. For the exemplary embodiment described above where the magnetic strip 110 is a 900 nm wide, 3 μm long multilayer structure with 15 sets of layers 2.7 nm thick Pt, 0.8 nm thick $Co_{60}Fe_{20}B_{20}$, and 1.5 nm thick MgO, the current density amplitude used to move skyrmions 350 is approximately $2 \times 10^{11}$ A/m$^2$ with pulse widths of 6 ns. At lower current densities, the skyrmions remain pinned. For pulse widths less than 10 ns, a large range of current amplitude densities can be used, as shown in FIG. 11A, to move skyrmions without generating new skyrmions in the process. Low amplitude current pulses 320 can move skyrmions 350 in a direction substantially parallel to the flow of current. In comparison to the high amplitude current pulses 310 used for skyrmion generation, the transverse motion, e.g., along the negative y-direction, can be smaller. As a result, longer pulse widths can be used to increase the distance skyrmions 350 are moved per pulse with reduced risk of collision with the edge of the magnetic strip 110.

Figure 12:
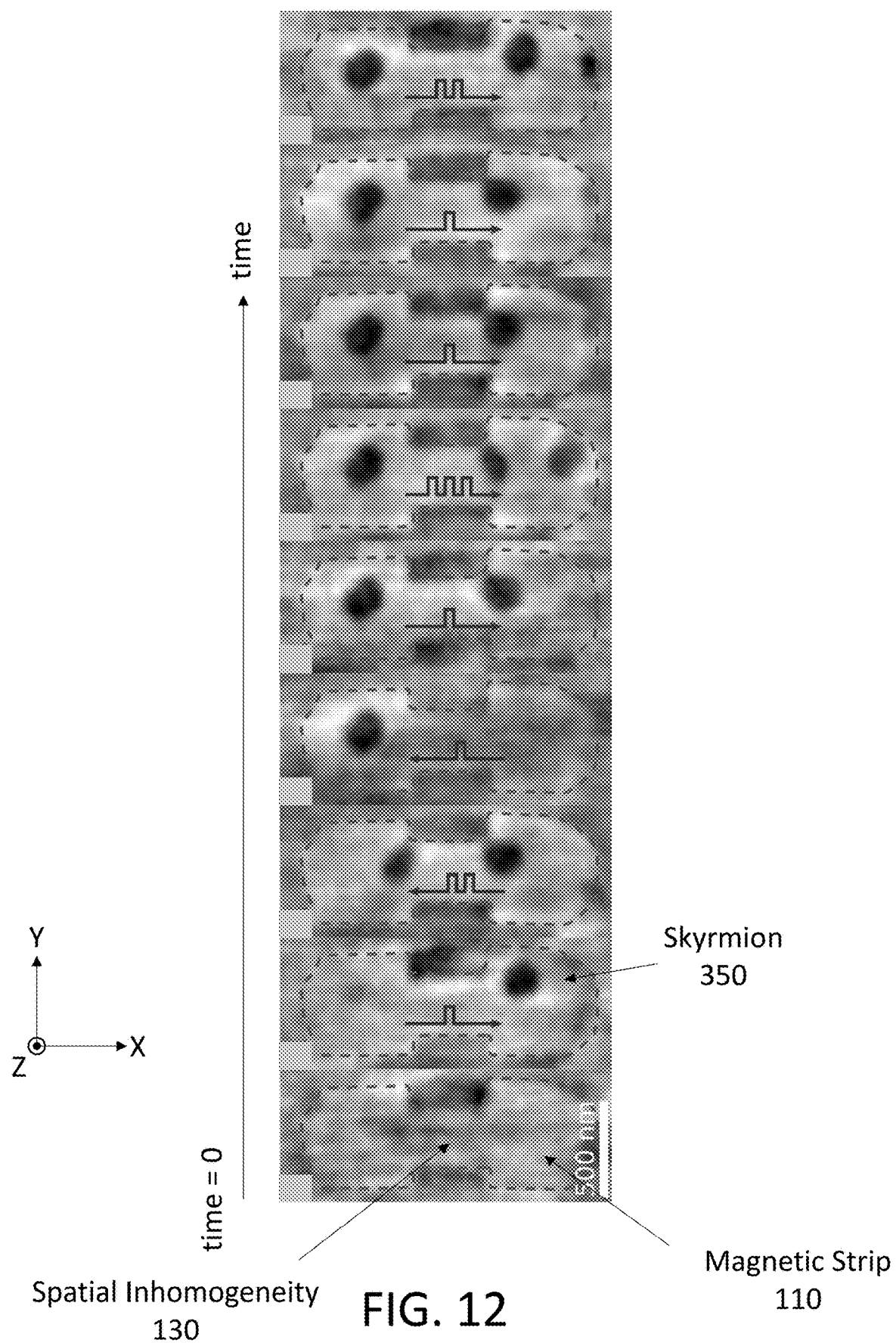
FIG. 12 shows a series of images detailing the generation and movement of magnetic skyrmions on a magnetic strip with a constriction.

The current pulse generator 140 can also inject current pulses along either direction along the magnetic strip 110 in order to move skyrmions 350 back and forth along the magnetic strip 110. As an exemplary demonstration, FIG. 12 shows a series of images of skyrmions generated from a constriction in the magnetic strip 110. The constriction is configured to reduce the width of the magnetic strip 110 such that skyrmions are either repelled or annihilated when moved towards the constriction. As shown, skyrmions can be generated from the constriction, which can then be moved either moved away or towards the constriction depending on the direction the current pulses are applied.

Detection Methods

Figure 13:
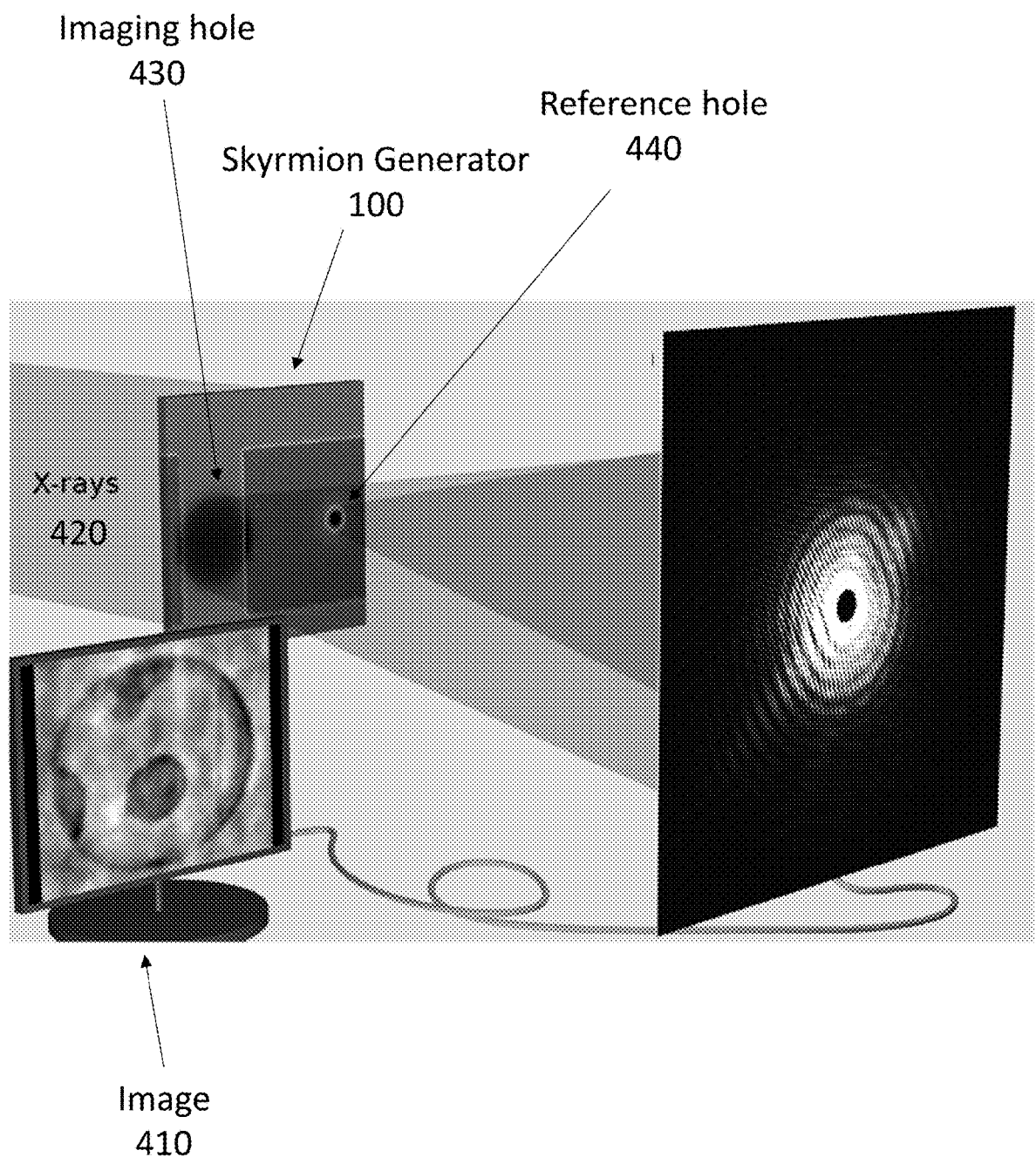
FIG. 13 is a schematic illustration of an x-ray holographic imaging system used to detect the presence of magnetic skyrmions on the magnetic strip.
Figure 14:
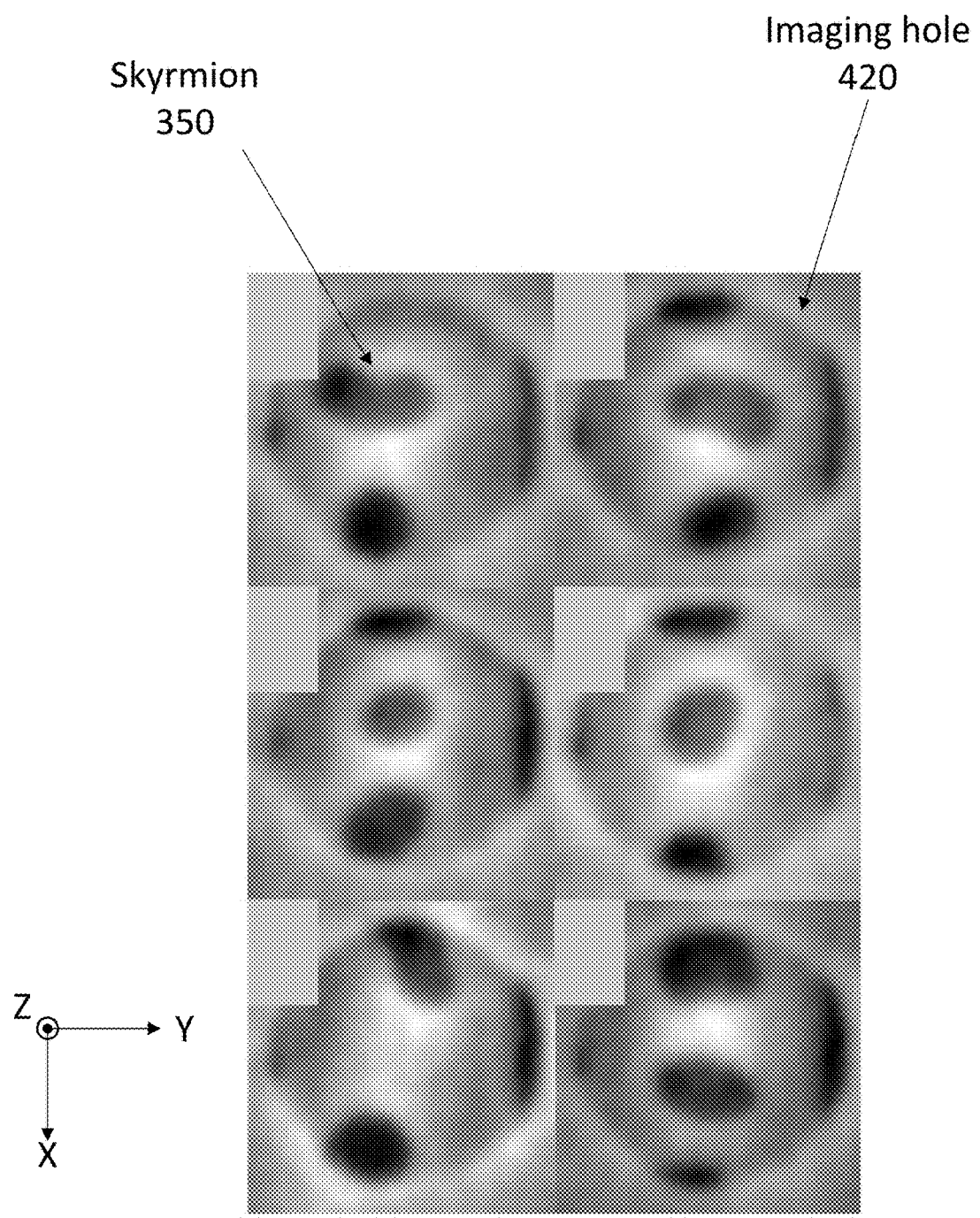
FIG. 14 shows a series of images of magnetic skyrmions detected by an x-ray holographic imaging system through an imaging hole formed on the substrate supporting the magnetic strip.

The skyrmion generator 100 can also include a reading element to detect skyrmions generated in the magnetic strip 110. The reading element can be an optical imaging device configured to detect skyrmions by imaging a portion of the magnetic strip 110. For example, the reading element can be an x-ray holographic imaging system, as shown in FIG. 13. The x-ray holographic imaging system can form an image 410 of the skyrmion generator 100 by detecting x-rays 420 transmitted through an imaging hole 430 on the magnetic strip 110 and a reference hole 440 on the skyrmion generator 100. In order to limit the detection of x-rays 420 to one or more portions of the skyrmion generator 100, a gold layer can be coated on the opposing side of a substrate supporting the magnetic strip 110. The gold layer can then be patterned with an imaging hole 430 positioned substantially over a portion of the magnetic strip 110 and a reference hole 440 positioned over a portion of the substrate far from the magnetic strip 110 and the contact pads 120, as shown in FIG. 13. Exemplary images of skyrmions 350 acquired using an x-ray holographic imaging system is shown in FIG. 14.

Figure 15:
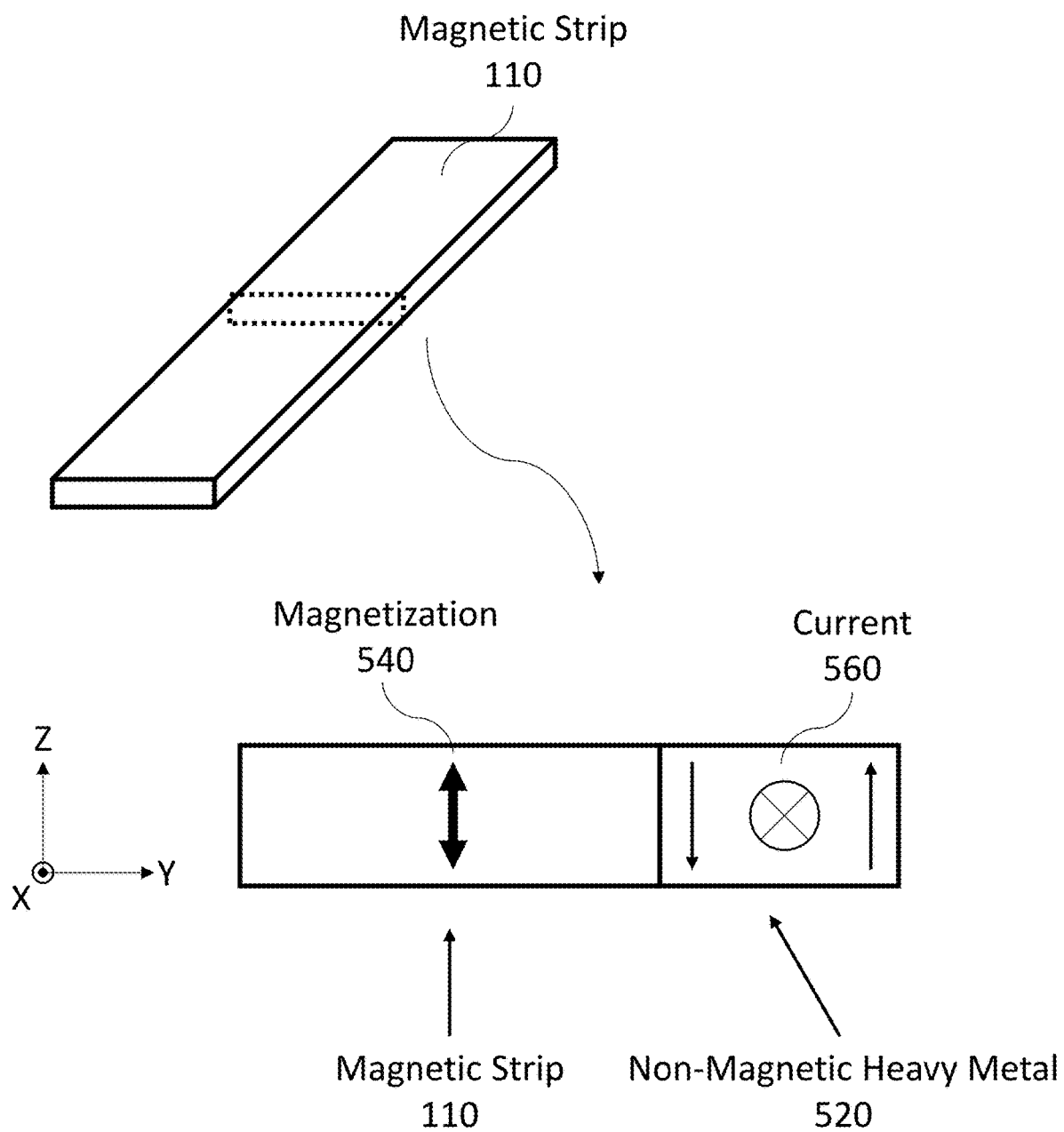
FIG. 15 is a schematic illustration of a magnetic device configured to have a unidirectional spin Hall magnetoresistance to detect the out-of-plane magnetization in the magnetic strip.

The reading element can also be configured to electronically detect the presence of skyrmions. The reading element can be a magnetic device configured to have a unidirectional spin Hall magnetoresistance such that changes in the out-of-plane magnetization in the magnetic strip 110 can be detected. For example, a non-magnetic heavy metal 520, e.g., Pt, can be deposited onto a portion of the magnetic strip 110, as shown in FIG. 15. The non-magnetic heavy metal can have a resistance configured to change according to the out-of-plane magnetization 540 in the magnetic strip 110 via interactions between the out-of-plane magnetization 540 and accumulated spin in the non-magnetic heavy metal 520 driven by the SHE. By applying a current 560 through the non-magnetic heavy metal 520, the change in resistance can be detected.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of creating a magnetic skyrmion, the method comprising:
   injecting a spin orbit torque current pulse along a length of a strip of magnetic material towards a spatial inhomogeneity in the strip of magnetic material so as to create the magnetic skyrmion at the spatial inhomogeneity,
   wherein the strip of magnetic material has a width shorter than the length.

2. The method of claim 1, wherein the spin orbit torque current pulse has a duration of less than ten nanoseconds.

3. The method of claim 1, wherein the spin orbit torque current pulse has a peak current density of at least $2.6 \times 10^{11}$ A/m².

4. The method of claim 1, wherein the spatial inhomogeneity comprises a constriction in the strip of magnetic material.

5. The method of claim 1, wherein the spatial inhomogeneity comprises a region in the strip of magnetic material with magnetic anisotropy.

6. The method of claim 1, further comprising, before injecting the spin orbit torque current pulse:
saturating the strip of magnetic material with an out-of-plane magnetic field; and
reducing an amplitude of the out-of-plane magnetic field.

7. The method of claim 1, further comprising, before injecting the spin orbit torque current pulse:
heating the strip of magnetic material with a heat source so as to reduce a current density required to create the magnetic skyrmion.

8. The method of claim 7, wherein heating the strip of magnetic material comprises injecting at least one current pulse into the strip of magnetic material.

9. The method of claim 1, further comprising, after injecting the spin orbit torque current pulse:
injecting at least one current pulse into the strip of magnetic material to drive the magnetic skyrmion away from the spatial inhomogeneity.

10. The method of claim 1, further comprising:
injecting another spin orbit torque current pulse towards the spatial inhomogeneity in the strip of magnetic material so as to create another magnetic skyrmion at the spatial inhomogeneity.

11. The method of claim 1, further comprising:
driving the magnetic skyrmion towards a constriction in the strip of magnetic material so as to annihilate the magnetic skyrmion.

12. An apparatus comprising:
a strip of magnetic material having a spatial inhomogeneity, the strip of magnetic material having a length and a width shorter than the length; and
a current pulse generator, in electrical communication with the strip of magnetic material, to inject a spin orbit torque current pulse along the length of the strip of magnetic material toward the spatial inhomogeneity so as to generate a magnetic skyrmion.

13. The apparatus of claim 12, wherein the strip of magnetic material is at least 30% wider than a diameter of the magnetic skyrmion.

14. The apparatus of claim 12, wherein the spatial inhomogeneity comprises a constriction in the strip of magnetic material.

15. The apparatus of claim 12, wherein the current pulse generator is configured to generate the spin orbit torque current pulse with a duration of less than ten nanoseconds.

16. The apparatus of claim 12, wherein the current pulse generator is configured to generate the spin orbit torque current pulse with a peak current density of at least $2.6 \times 10^{11}$ A/m².

17. The apparatus of claim 12, wherein the current pulse generator is configured to inject at least one current pulse into the strip of magnetic so as to reduce a current density required to create the magnetic skyrmion before injecting the spin orbit torque current pulse.

18. The apparatus of claim 12, wherein the current pulse generator is configured to inject at least one current pulse into the strip of magnetic so to drive the magnetic skyrmion away from the spatial inhomogeneity.

19. The apparatus of claim 12, wherein the current pulse generator is configured to inject another spin orbit torque current pulse towards the spatial inhomogeneity in the strip of magnetic material so as to create another magnetic skyrmion at the spatial inhomogeneity.

20. The apparatus of claim 12, wherein the current pulse generator is configured to drive the magnetic skyrmion towards a constriction in the strip of magnetic so as to annihilate the magnetic skyrmion.

21. The apparatus of claim 12, further comprising:
an external magnetic field source, in electromagnetic communication with the strip of magnetic material, to saturate the strip of magnetic material with an out-of-plane magnetic field before the current pulse generator injects the spin orbit torque current pulse.

* * * * *